United States Patent
Takasaki et al.

(10) Patent No.: US 8,079,435 B2
(45) Date of Patent: Dec. 20, 2011

(54) ELECTRIC VEHICLE

(75) Inventors: Seiichi Takasaki, Okazaki (JP); Kei Fujita, Tempaku-ku (JP); Haruchika Nishino, Okazaki (JP)

(73) Assignees: Mitsubishi Jidosha Kogyo Kabushiki Kaisha, Tokyo (JP); Mitsubishi Jidosha Engineering Kabushiki Kaisha, Aichi (JP)

( * ) Notice: Subject to any disclaimer, the term of this patent is extended or adjusted under 35 U.S.C. 154(b) by 144 days.

(21) Appl. No.: 12/410,148

(22) Filed: Mar. 24, 2009

(65) Prior Publication Data

US 2009/0242299 A1    Oct. 1, 2009

Related U.S. Application Data

(63) Continuation of application No. PCT/JP2008/053995, filed on Mar. 5, 2008.

(30) Foreign Application Priority Data

Sep. 28, 2007    (JP) ................................. 2007-254261

(51) Int. Cl.
*B60R 16/04* (2006.01)
(52) U.S. Cl. ..................... 180/68.5; 180/65.1
(58) Field of Classification Search .......... 180/65.1, 180/65.29, 68.5, 69.1; 296/184.1, 187.08, 296/193.07
See application file for complete search history.

(56) References Cited

U.S. PATENT DOCUMENTS

| | | | | |
|---|---|---|---|---|
| 4,365,681 A * | 12/1982 | Singh | ........................... | 180/68.5 |
| 5,390,754 A * | 2/1995 | Masuyama et al. | .......... | 180/68.5 |
| 5,501,289 A * | 3/1996 | Nishikawa et al. | .......... | 180/68.5 |
| 5,534,364 A * | 7/1996 | Watanabe et al. | ................ | 429/61 |
| 5,594,199 A * | 1/1997 | Ciaccio | ........................ | 174/382 |
| 5,853,058 A * | 12/1998 | Endo et al. | ..................... | 180/65.1 |
| 5,948,298 A * | 9/1999 | Ijaz | ................ | 219/209 |
| 6,085,854 A * | 7/2000 | Nishikawa | .................... | 180/68.5 |
| 6,109,380 A * | 8/2000 | Veenstra | ...................... | 180/68.5 |
| 6,123,565 A * | 9/2000 | Bierek et al. | .................. | 439/377 |
| 6,188,574 B1 * | 2/2001 | Anazawa | ...................... | 361/695 |
| 6,189,635 B1 * | 2/2001 | Schuler et al. | ............. | 180/68.5 |
| 6,227,322 B1 * | 5/2001 | Nishikawa | .................... | 180/68.5 |
| 6,483,719 B1 * | 11/2002 | Bachman | ...................... | 361/816 |
| 6,598,691 B2 * | 7/2003 | Mita et al. | .................... | 180/65.1 |
| 7,051,825 B2 * | 5/2006 | Masui et al. | ................. | 180/68.5 |
| 7,469,759 B2 * | 12/2008 | Botzelmann | ............... | 180/65.28 |
| 7,559,389 B2 * | 7/2009 | Yamashita | ................ | 180/65.31 |
| 7,614,469 B2 * | 11/2009 | Kumar et al. | ................ | 180/68.5 |
| 7,631,712 B2 * | 12/2009 | Watanabe | .................... | 180/68.5 |

(Continued)

FOREIGN PATENT DOCUMENTS

JP    8-186390 A    7/1996

(Continued)

*Primary Examiner* — J. Allen Shriver, II
*Assistant Examiner* — Travis Coolman
(74) *Attorney, Agent, or Firm* — Birch, Stewart, Kolasch & Birch, LLP (57) ABSTRACT

A battery unit is provided under a floor panel. The battery unit is arranged between a pair of right and left side members. The battery unit is provided with a battery case. The battery case includes a tray member and cover member. Electric components are contained in the battery case. Beam members made of metal are attached to the tray member. Both end portions of these beam members are supported by the side members. The tray member includes a resin and insert members made of metal provided inside the resin. The insert members include metal plates arranged on the front side and rear side of the electric components.

8 Claims, 7 Drawing Sheets

U.S. PATENT DOCUMENTS

| | | | |
|---|---|---|---|
| 7,688,582 B2 * | 3/2010 | Fukazu et al. | 361/690 |
| 2003/0016519 A1 * | 1/2003 | Bachman | 361/818 |
| 2004/0033415 A1 * | 2/2004 | Chen et al. | 429/99 |
| 2004/0161664 A1 * | 8/2004 | Hanafusa et al. | 429/162 |
| 2005/0173170 A1 * | 8/2005 | Miyajima et al. | 180/68.5 |
| 2006/0016633 A1 * | 1/2006 | Fujii et al. | 180/68.5 |
| 2007/0284167 A1 * | 12/2007 | Watanabe et al. | 180/68.5 |
| 2008/0156554 A1 * | 7/2008 | Noto | 180/65.3 |
| 2008/0196957 A1 * | 8/2008 | Koike et al. | 180/68.5 |
| 2009/0166116 A1 * | 7/2009 | Kiya et al. | 180/68.5 |
| 2009/0183935 A1 * | 7/2009 | Tsuchiya | 180/68.1 |
| 2010/0025137 A1 * | 2/2010 | Mughal | 180/68.5 |

FOREIGN PATENT DOCUMENTS

| | | |
|---|---|---|
| JP | 2000-351328 A | 12/2000 |
| JP | 2001-294048 A | 10/2001 |
| JP | 2004-196217 A | 7/2004 |
| WO | WO-2007/043341 A1 | 4/2007 |

* cited by examiner

ELECTRIC VEHICLE

CROSS REFERENCE TO RELATED APPLICATIONS

This is a continuation Application of PCT Application No. PCT/JP2008/053995, filed Mar. 5, 2008, which was published under PCT Article 21(2) in Japanese.

This application is based upon and claims the benefit of priority from prior Japanese Patent Application No. 2007-254261, filed Sep. 28, 2007, the entire contents of which are incorporated herein by reference.

BACKGROUND OF THE INVENTION

1. Field of the Invention

The present invention relates to an electric vehicle which runs by means of a motor using a battery as a power source.

2. Description of the Related Art

It is known that in an electric vehicle using a battery as a power source, an electromagnetic wave is generated from, for example, the motor, current control circuit or the like. There is the possibility of the electromagnetic wave generated in the electric vehicle adversely affecting various types of electric components mounted on the vehicle body. For this reason, it is desirable that an electromagnetic shield means be provided for electric components which may be adversely affected by an electromagnetic wave or electric equipments which might be electromagnetic wave generation sources.

In, for example, Jpn. Pat. Appln. KOKAI Publication No. 8-186390, an electromagnetic shield means for a battery case is described. As the electromagnetic shield means, paint for electromagnetic shield having an effect of reflecting an electromagnetic wave is applied to a surface of the battery case. When electromagnetic shield paint is applied to the surface or the like of the battery case, as in the case of this prior art technique, a process for applying the paint, process for drying the applied paint, and the like are required, in addition to that the paint for electromagnetic shield itself is expensive. For this reason, the electromagnetic shield means not only takes a lot of time, but also requires great expenses.

In order to reduce the usage of the paint for electromagnetic shield, it is conceivable that the paint for electromagnetic shield is applied only to a part of the battery case around an electric component to be shielded inside the battery case. Alternatively, it is also conceivable that an electromagnetic shield member such as an iron plate is arranged inside the battery case. However, providing a conductive member in the small space inside the battery case is not desirable because a factor for causing an electric short circuit is provided.

BRIEF SUMMARY OF THE INVENTION

The present invention provides an electric vehicle in which a battery unit mounted on the vehicle body can be shielded against an electromagnetic wave in a relatively simple and easy manner.

An electric vehicle of the present invention comprises a frame structure including a pair of right and left side members made of metal, arranged at a lower part of a vehicle body, a floor panel made of metal provided on the frame structure, a battery unit including a battery case arranged between the pair of side members on the undersurface side of the floor panel, the battery case containing therein battery modules and electric components electrically connected to the battery modules, and the upper side of the electric components being electromagnetically shielded by the floor panel, a front electromagnetic shield portion arranged on the vehicle-front side with respect to the electric components, a rear electromagnetic shield portion arranged on the vehicle-rear side with respect to the electric components, and an under electromagnetic shield portion arranged on the undersurface side of the battery case.

According to the present invention, it is possible to prevent electric components contained in the battery unit and the like arranged under the floor panel of the electric vehicle from being adversely affected by an electromagnetic wave. Further, it is also possible to prevent an electromagnetic wave generated from the battery unit from adversely affecting the neighboring electric components and the like.

In an aspect of the present invention, each of the front electromagnetic shield portion and the rear electromagnetic shield portion is constituted of an insert member made of metal embedded in the resin constituting the battery case.

Further, an under cover for covering the battery case from below may be arranged below the battery case, and the under electromagnetic shield portion may be constituted of a shield member provided on the under cover.

In the present invention, beam members made of metal, extending in the width direction of the vehicle body are provided under the battery case, both end portions of the beam members are supported by the pair of side members, the under electromagnetic shield portion is constituted of the beam members, and portions overlapping the beam members made of metal when viewed from above the vehicle body may not be provided with the shield member of the under cover.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be described below with reference to FIGS. 1 to 7.

Figure 1:
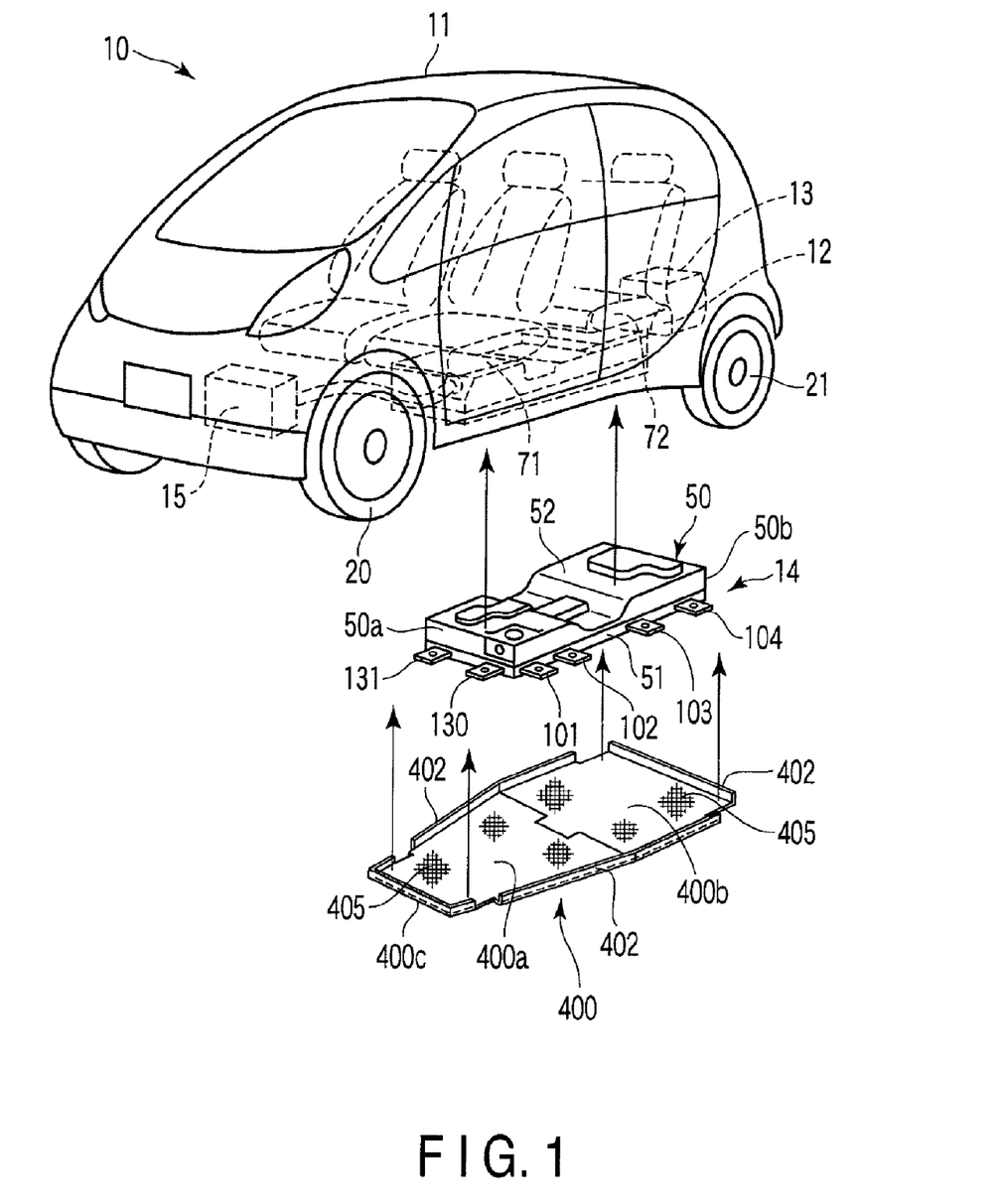
FIG. 1 is a perspective view of an electric vehicle, battery unit, and under cover according to an embodiment of the present invention.

FIG. 1 shows an example of an electric vehicle 10. This electric vehicle 10 is provided with a motor 12 for traveling, and charging equipment 13 which are arranged at the rear part of a vehicle body 11, a battery unit 14 arranged under the floor of the vehicle body 11, and the like. A heat exchanger unit 15 for air-conditioning is arranged at the front part of the vehicle body 11.

Front wheels 20 of the vehicle 10 are supported by the vehicle body 11 by means of front suspensions (not shown). Rear wheels 21 are supported by the vehicle body 11 by means of rear suspensions (not shown). An example of the rear suspension is a trailing arm type rear suspension.

Figure 2:
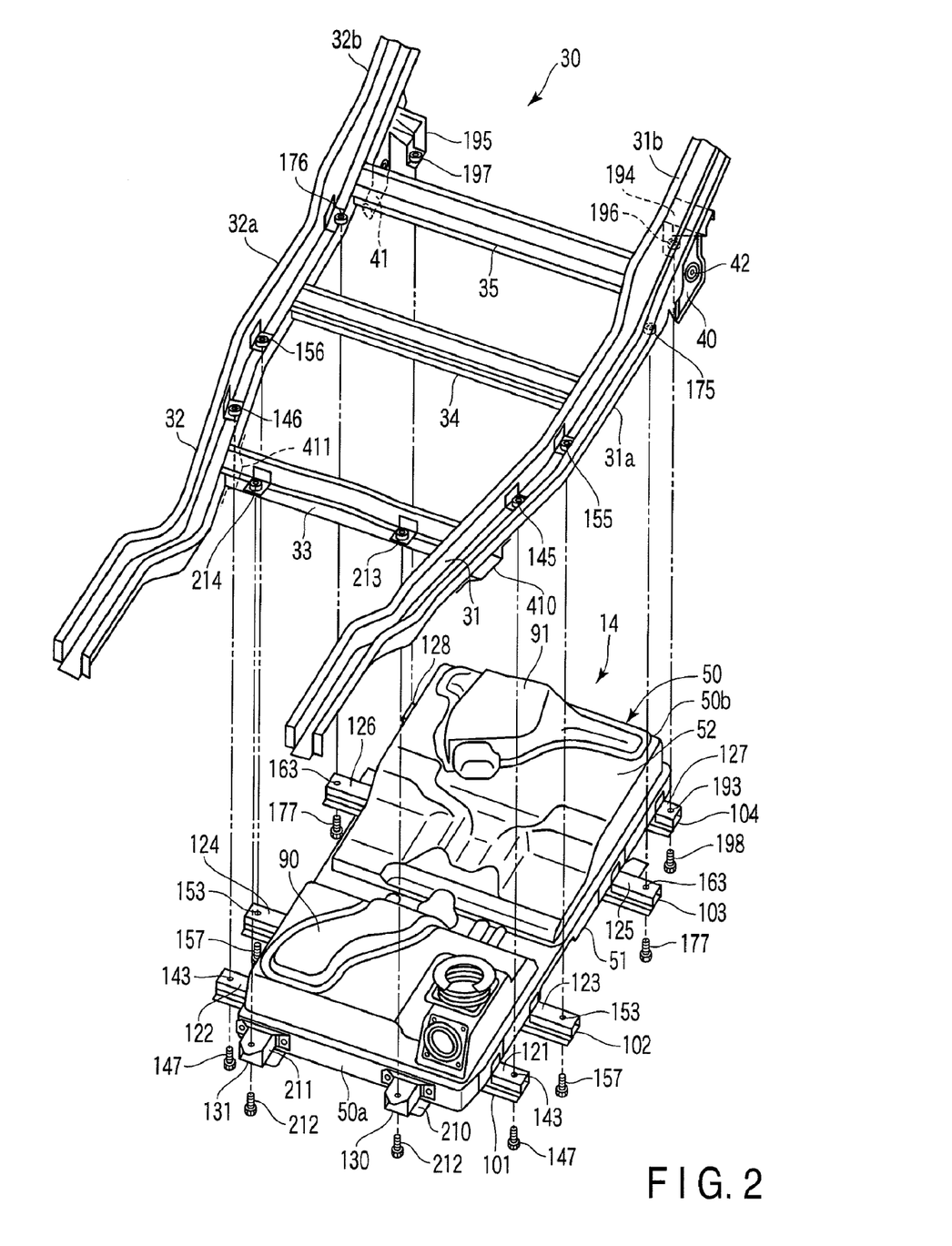
FIG. 2 is a perspective view of the frame structure and battery unit of the electric vehicle shown in FIG. 1.

FIG. 2 shows a frame structure 30 constituting a lower skeletal structure of the vehicle body 11, and the battery unit 14 to be attached to the frame structure 30.

The frame structure 30 includes a pair of right and left side members 31 and 32 extending in the back-and-forth direction of the vehicle body 11, and cross members 33, 34, and 35 extending in the width direction of the vehicle body 11. The cross members 33, 34, and 35 are fixed to predetermined positions of the side members 31 and 32 by welding. Each of the side members 31 and 32, and cross members 33, 34, and 35 is constituted of metal (for example, steel). That is, the side members 31 and 32 also function as an electromagnetic shield portion for intercepting electromagnetic waves from both the right and left sides of the battery unit 14.

Suspension arm support brackets 40 and 41 are provided at the rear parts of the side members 31 and 32. Each of the suspension arm support brackets 40 and 41 is fixed to a predetermined position of each of the side members 31 and 32 by welding. Each of the suspension arm support brackets 40 and 41 is provided with an axis section 42. Front end parts of the trailing arms are attached to these axis sections 42.

Figure 3:
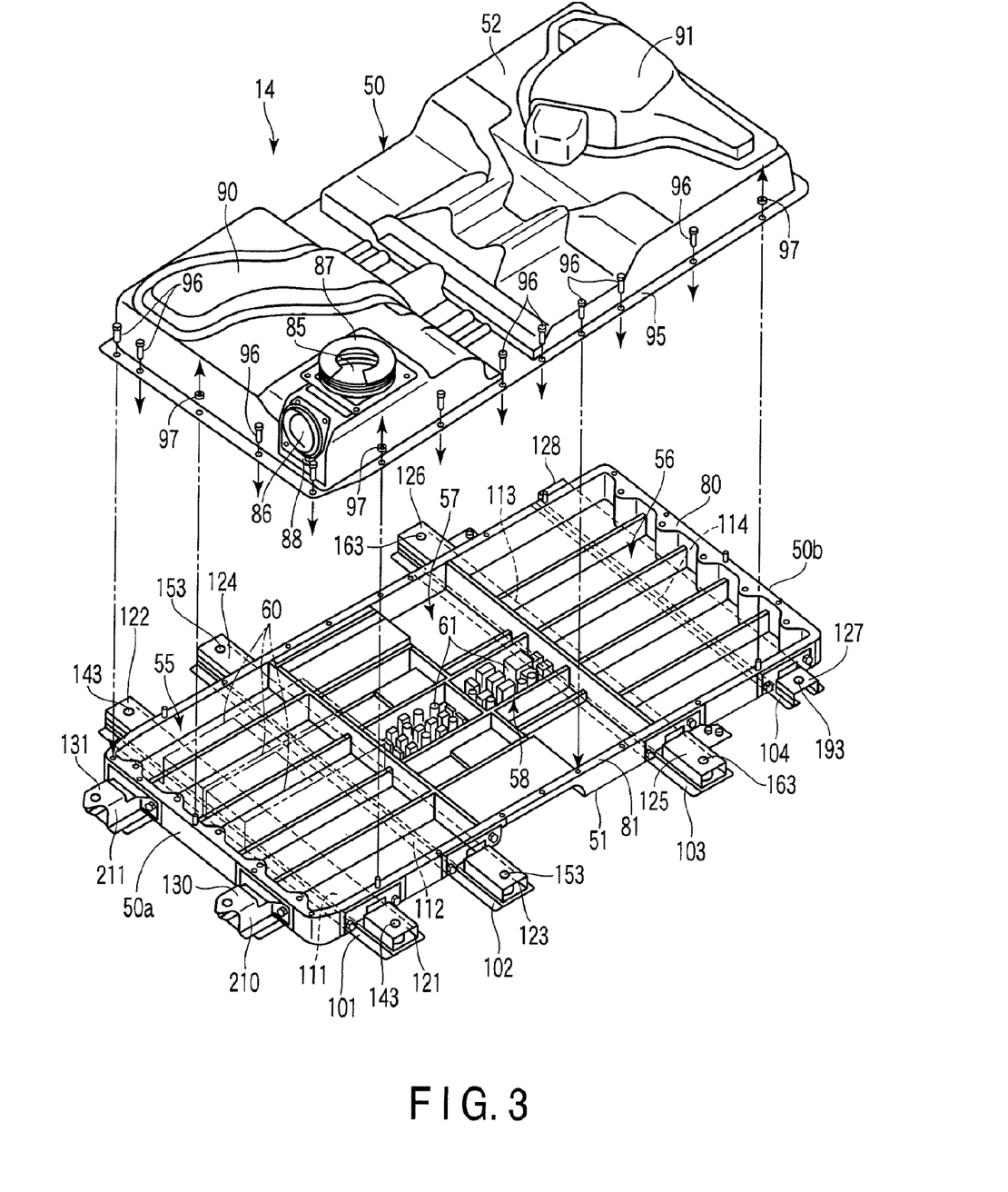
FIG. 3 is a perspective view of the battery case of the battery unit and beam members shown in FIG. 2.

As shown in FIG. 3, the battery unit 14 is provided with a battery case 50. The battery case 50 includes a tray member 51 positioned on the lower side, and a cover member 52 positioned on the upper side. A front battery containing section 55 is formed at the front half part of the battery case 50. A rear battery containing section 56 is formed at the rear half part of the battery case 50. A center battery containing section 57, an electric circuit containing section 58, and the like are formed between the front battery containing section 55 and rear battery containing section 56.

A battery module 60 (only part thereof is shown by two-dot chain lines in FIG. 3) is contained in each of the battery containing sections 55, 56, and 57. An example of the battery module 60 is a battery module formed by connecting, in series, a plurality of cells each of which is constituted of a lithium ion battery.

Figure 7:
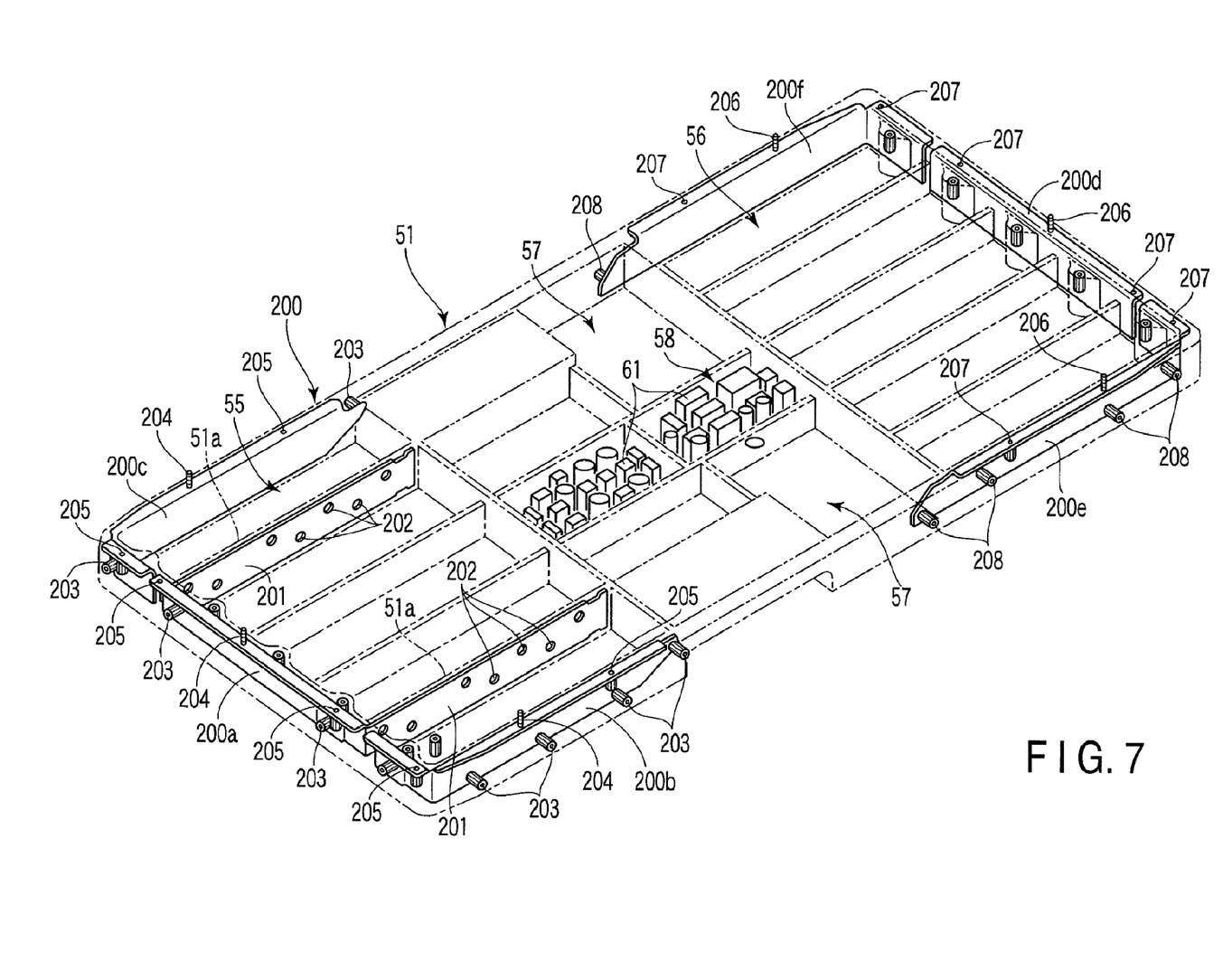
FIG. 7 is a perspective view of insert members to be embedded in the tray member of the battery case shown in FIG. 2.

A monitor for detecting a state of the battery module 60, electric components 61 (part of them are schematically shown in FIGS. 3 and 7) and the like for managing control and the like are contained in the electric circuit containing section 58. The electric components 61 are electrically connected to the battery modules 60. There is the possibility of the electric components 61 being adversely affected by an electromagnetic wave, and hence the electric components 61 are provided with an electromagnetic shield means to be described later.

Figure 4:
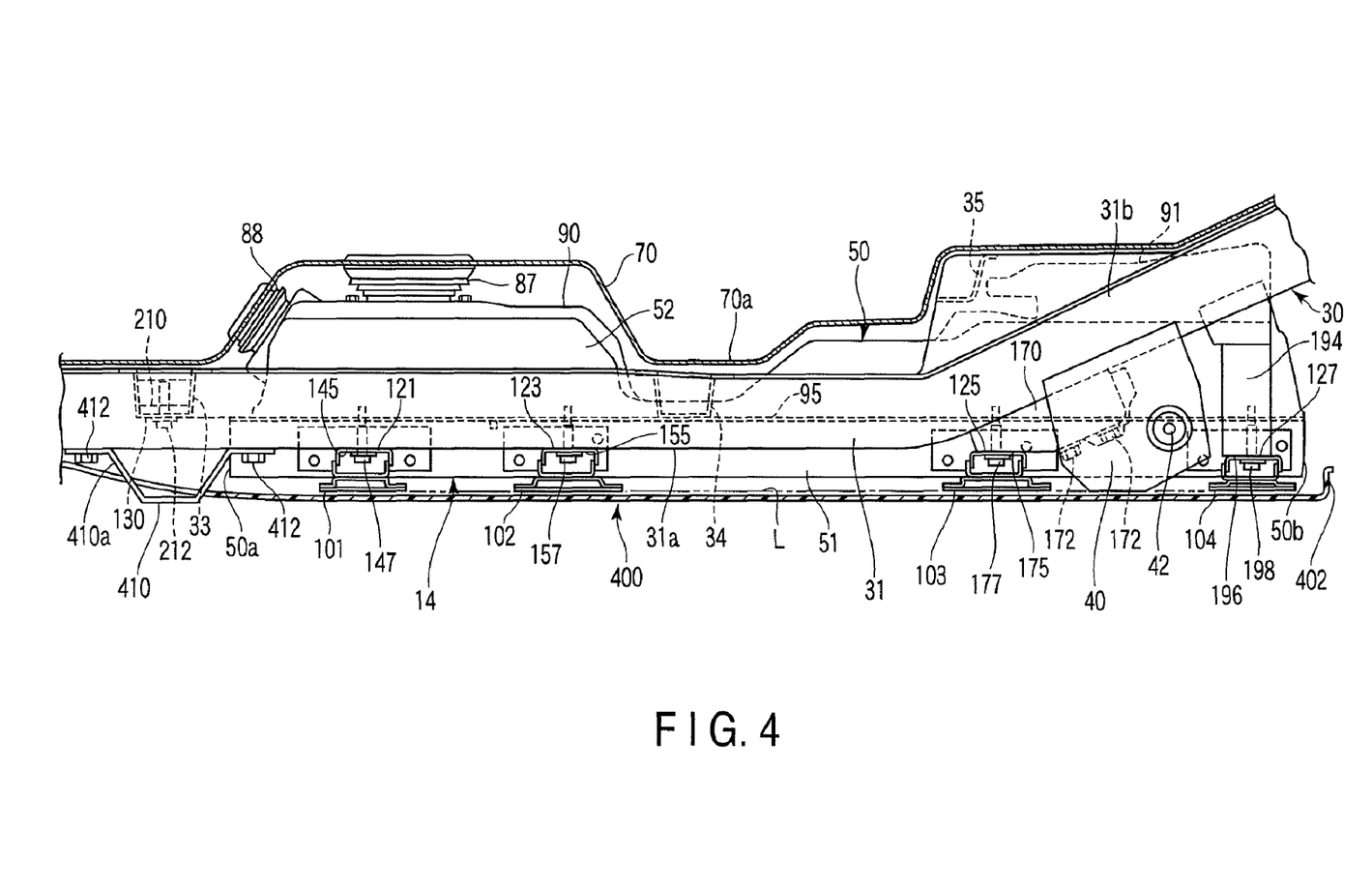
FIG. 4 is a side view of the frame structure and battery unit of the electric vehicle shown in FIG. 1.

As shown in FIG. 4, the battery unit 14 is arranged on the undersurface side of a floor panel 70 made of steel, and having an electromagnetic shielding effect. The upper side of the electric components 61 is magnetically shielded by the floor panel 70. That is, the floor panel 70 also functions as an upper electromagnetic shield portion for intercepting an electromagnetic wave from above the battery unit 14. Further, the floor panel 70 also functions as a shield for preventing an electromagnetic wave generated from the battery unit 14 from being directed upward. The floor panel 70 extends in the back-and-forth direction and width direction of the vehicle body 11 to constitute a floor part of the vehicle body 11.

The floor panel 70 is fixed to a predetermined position of the frame structure 30 including the side members 31 and 32 by welding. Front seats 71 (shown in FIG. 1) and rear seats 72 are arranged above the floor panel 70. The front battery containing section 55 of the battery unit 14 is arranged below the front seats 71. The rear battery containing section 56 of the battery unit 14 is arranged below the rear seats 72. The floor panel 70 includes a concave portion 70a. The concave portion 70a is formed between the front battery containing section 55 and rear battery containing section 56. This concave portion 70a is positioned in the vicinity of the feet of the occupants seated on the rear seats 72.

The tray member 51 is a molded article formed by inserting metal insert members 200 (shown in FIG. 7) for reinforcement in an integrally molded synthetic resin member. This tray member 51 is formed into a box-like shape opened at its top surface. The synthetic resin which is the material of the tray member 51 is reinforced by, for example, fibers. A cover fitting surface 80 (shown in FIG. 3) is formed at a peripheral edge part of the top surface of the tray member 51. The cover fitting surface 80 is continuous over the whole circumference of the tray member 51. A waterproof seal member 81 is provided on the cover fitting surface 80.

As shown in FIG. 7, the insert members 200 includes three metal plates 200a, 200b, and 200c positioned on the front side of the tray member 51, and three metal plates 200d, 200e, and 200f positioned on the rear side of the tray member 51. These metal plates 200a to 200f are constituted of a metallic material having an electromagnetic shielding effect, and large bending rigidity, for example, a steel sheet.

The metal plates 200a, 200b, and 200c which are positioned on the front side are embedded at positions corresponding to the front part, and right left sides of the front battery containing section 55. A pair of right and left reinforcement plates 201 extending rearward is provided at both ends of the metal plate 200a on the center-front side. These reinforcement plates 201 are provided inside the resin constituting partition walls 51a of the tray member 51. These metal plates 200a, 200b, and 200c have a function of reinforcing the peripheral wall of the tray member 51. The metal plate 200a on the center-front side functions also as a front electromagnetic shield portion positioned on the vehicle-front side with respect to the electric components 61.

A plurality of holes 202 are formed in these reinforcement plates 201 in order to improve sticking of the plates 201 to the resin constituting the partition walls 51a. Further, each of the metal plates 200a, 200b, and 200c is provided with embedded nuts 203 protruding in the horizontal direction, an anchor bolt 204 protruding upward, and nut portions 205 each of which is provided with a threaded hole.

The metal plates 200d, 200e, and 200f on the rear side are embedded at positions corresponding to the rear part, and right left sides of the rear battery containing section 56 of the tray member 51. An anchor bolt 206 protruding upward, and nut portions 207 each of which is provided with a threaded hole are provided on a top surface of each of the metal plates 200d, 200e, and 200f. Embedded nuts 208 protruding in the horizontal direction are fixed to the pair of right and left metal plates 200e and 200f. These metal plates 200d, 200e, and 200f have a function of reinforcing the peripheral wall of the tray member 51.

The metal plate 200d on the center-rear side functions also as a rear electromagnetic shield portion positioned on the vehicle-rear side with respect to the electric components 61. It should be noted that each of a front wall and rear wall of the battery case 50 may be provided with an electromagnetic shield member such as a metal mesh member in order to enhance the electromagnetic shielding effect at each of front and rear directions of the electric components 61. Each of right and left walls of the battery case 50 may also be provided with an electromagnetic shield member such as a metal mesh member in order to enhance the electromagnetic shielding effect at each of right and left areas of the battery case 50.

The cover member 52 is constituted of an integrally molded product of a synthetic resin reinforced by fibers. An opening 85 for service plug and cooling air introduction opening 86 are formed at a front part of the cover member 52. A bellows-like boot 87 is attached to the opening 85 for service plug. A bellows-like boot 88 is also attached to the cooling air introduction opening 86. A bypass flow path 90 for causing part of the cooling air to flow therethrough, cooling fan containing section 91, and the like are provided on the top surface of the cover member 52.

A flange portion 95 is formed at a peripheral edge part of the cover member 52. The flange portion 95 is continuous over the whole circumference of the cover member 52. A rear metal plate (not shown) made of metal serving as measures against a rear collision is arranged on the rear surface of the cover member 52. The rear metal plate is fixed to the tray member 51 together with the flange portion 95 of the cover member 52, and can function as a rear electromagnetic shield portion.

The flange portion 95 of the cover member 52 is placed on the cover fitting surface 80 of the tray member 51. Further, the tray member 51 and cover member 52 are fixed to each other through the seal member 81 in a watertight manner by means of bolts 96 and nuts 97 shown in FIG. 3.

Figure 5:
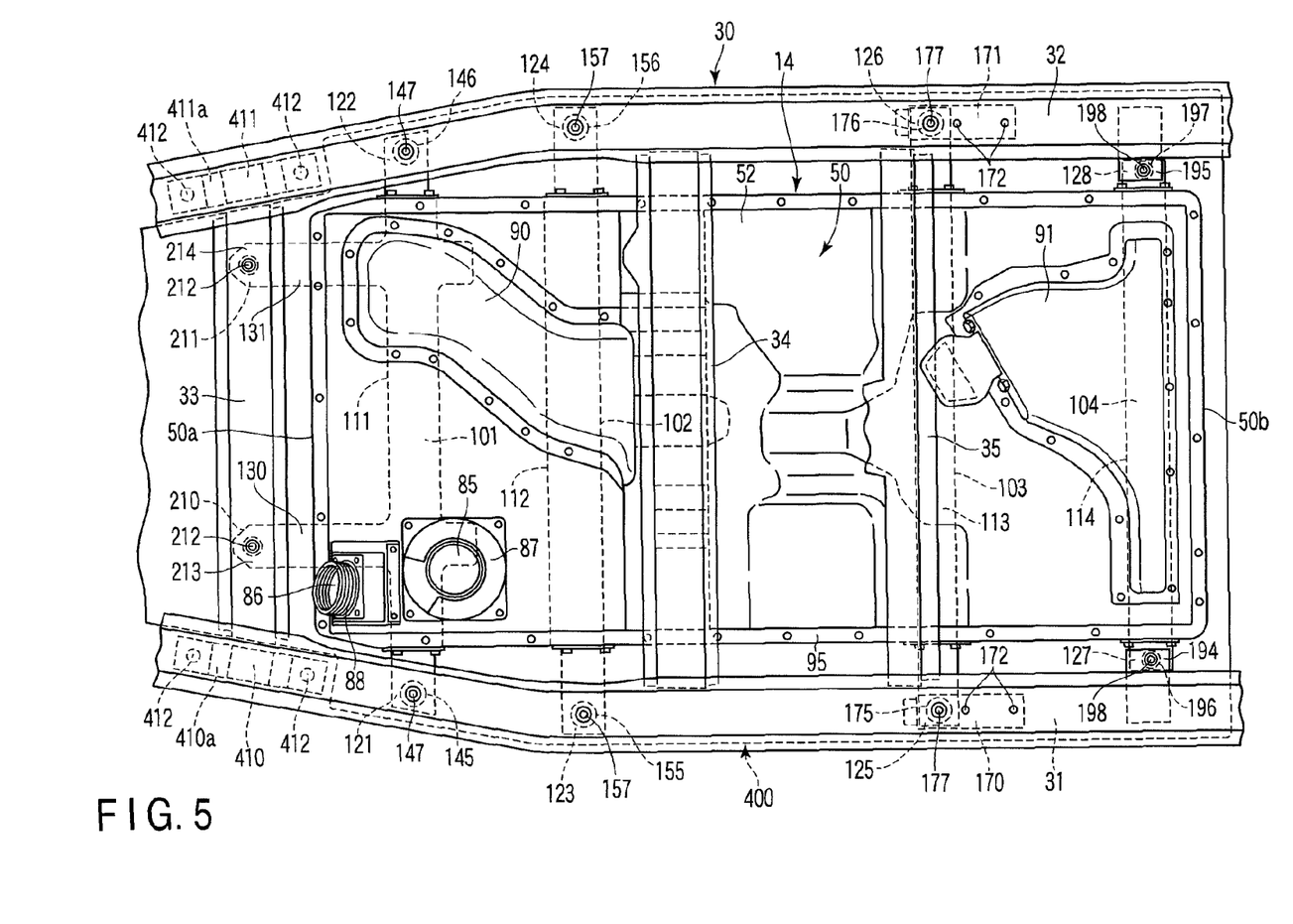
FIG. 5 is a plan view of the frame structure and battery unit of the electric vehicle shown in FIG. 1 viewed from above.

A plurality of (for example, four) beam members 101, 102, 103, and 104 are provided on the undersurface side of the tray member 51. As shown in FIGS. 3 and 5, the beam members 101, 102, 103, and 104 respectively include beam bodies 111, 112, 113, and 114 extending in the width direction of the vehicle body 11.

The first beam body 111 from the front is provided with joining portions 121 and 122 at both ends thereof. The second beam body 112 from the front is provided with joining portions 123 and 124 at both ends thereof. The third beam body 113 from the front is provided with joining portions 125 and 126 at both ends thereof. The fourth (rearmost) beam body 114 from the front is provided with joining portions 127 and 128 at both ends thereof. A pair of right and left front support members 130 and 131 is provided at a front end part of the battery unit 14.

The beam members 101, 102, 103, and 104 are each provided with strength sufficient to support the weight of the battery unit 14. Furthermore, these beam members are constituted of a metallic material (for example, a steel sheet) having an effect of intercepting an electromagnetic wave. That is, the beam members 101, 102, 103, and 104 function also as an under electromagnetic shield portion for intercepting an electromagnetic wave from below the battery unit 14.

A bolt inserting hole 143 (shown in FIGS. 2 and 3) is formed in each of the joining portions 121 and 122 provided at both the ends of the first beam member 101 from the front. The bolt inserting hole 143 penetrates the joining portion 121 or 122 in the vertical direction. The side members 31 and 32 are provided with battery unit fitting portions 145 and 146 at positions opposed to the joining portions 121 and 122. The battery unit fitting portions 145 and 146 are provided with nut members. A bolt 147 (shown in FIGS. 2 and 4) is inserted into the bolt inserting hole 143 from below the joining portion 121 or 122. The bolt 147 is screwed into the nut member of the battery unit fitting portion 145 or 146 to be fastened. As a result of this, the joining portions 121 and 122 of the first beam member 101 are fixed to the side members 31 and 32.

A bolt inserting hole 153 (shown in FIGS. 2 and 3) is formed in each of the joining portions 123 and 124 provided at both the ends of the second beam member 102 from the front. The bolt inserting hole 153 penetrates the joining portion 123 or 124 in the vertical direction. The side members 31 and 32 are provided with battery unit fitting portions 155 and 156 at positions opposed to the joining portions 123 and 124. The battery unit fitting portions 155 and 156 are provided with nut members. A bolt 157 (shown in FIGS. 2 and 4) is inserted into the bolt inserting hole 153 from below the joining portion 123 or 124. The bolt 157 is screwed into the nut member of the battery unit fitting portion 155 or 156 to be fastened. As a result of this, the joining portions 123 and 124 of the second beam member 102 are fixed to the side members 31 and 32.

A bolt inserting hole 163 (shown in FIGS. 2 and 3) is formed in each of the joining portions 125 and 126 provided at both the ends of the third beam member 103 from the front. The bolt inserting hole 163 penetrates the joining portion 125 or 126 in the vertical direction. As shown in FIGS. 4 and 5, load transmission members 170 and 171 are fixed to the side members 31 and 32 by means of bolts 172. The load transmission members 170 and 171 are provided above the joining portions 125 and 126 of the third beam member 103 from the front. The one load transmission member 170 is welded to one suspension arm support bracket 40. The other load transmission member 171 is welded to the other suspension arm support bracket 41.

That is, the load transmission members 170 and 171 are joined to the side members 31 and 32, and suspension arm support brackets 40 and 41. These load transmission members 170 and 171 constitute part of the frame structure 30. The load transmission members 170 and 171 are provided with battery unit fitting portions 175 and 176 including nut members.

A bolt 177 is inserted into the bolt inserting hole 163 from below the joining portion 125 or 126. The bolt 177 is screwed into the nut member of the battery unit fitting portion 175 or 176 to be fastened. As a result of this, the joining portions 125 and 126 of the third beam member 103 are fixed to the side members 31 and 32 through the load transmission members 170 and 171.

A bolt inserting hole 193 (shown in FIGS. 2 and 3) is formed in each of the joining portions 127 and 128 of the fourth beam member 104 from the front. The bolt inserting hole 153 penetrates the joining portion 127 or 128 in the vertical direction. The side members 31 and 32 are provided with extension brackets 194 and 195 at positions opposed to the joining portions 127 and 128. The extension brackets 194 and 195 extend to positions beneath kick-up frame portions 31*b* and 32*b* of the side members 31 and 32. The extension brackets 194 and 195 constitute part of the frame structure 30. These extension brackets 194 and 195 are provided with battery unit fitting portions 196 and 197 including nut members.

A bolt 198 (shown in FIGS. 2 and 4) is inserted into the bolt inserting hole 193 from below the joining portion 127 or 128. The bolt 198 is screwed into the nut member of the battery unit fitting portion 196 or 197 to be fastened. As a result of this, the joining portions 127 and 128 of the fourth beam member 104 are fixed to the side members 31 and 32 through the extension brackets 194 and 195.

As shown in FIG. 4, undersurfaces of the beam members 101, 102, 103, and 104 are positioned on the same plane L extending in the horizontal direction along the flat undersurface of the tray member 51. The first and second beam members 101 and 102 are directly fixed to the battery unit fitting portions 145, 146, 155, and 156 provided at the horizontal portions 31a and 32a of the side members 31 and 32.

The third and fourth beam members 103 and 104 are fixed to the battery unit fitting portions 175, 176, 196, and 197 provided beneath the kick-up frame portions 31b and 32b of the side members 31 and 32. That is, the third and fourth beam members 103 and 104 are located at positions downwardly offset from the kick-up frame portions 31b and 32b. Accordingly, the third beam member 103 is fixed to the battery unit fitting portions 175 and 176 through the load transmission members 170 and 171 each of which has a certain thickness in the vertical direction. The fourth beam member 104 is fixed to the battery unit fitting portions 196 and 197 by means of the extension brackets 194 and 195 extending to the positions beneath the kick-up frame portions 31b and 32b.

The front support members 130 and 131 which are located at the front end of the battery unit 14 protrude forward from the first beam member 101 from the front. The front support members 130 and 131 are joined to the beam member 101. As shown in FIG. 2, joining portions 210 and 211 provided to the front support members 130 and 131 are fixed to the battery unit fitting portions 213 and 214 of the cross member 33 by means of bolts 212.

As described above, the beam members 101, 102, 103, and 104 of the electric vehicle of this embodiment are provided between the right and left side members 31 and 32. The side members 31 and 32 are joined to each other by the beam members 101, 102, 103, and 104. Thus, the beam members 101, 102, 103, and 104 of the battery unit 14 can function as rigid members corresponding to the cross members.

Further, the load transmission members 170 and 171 are fixed to the suspension arm support brackets 40 and 41. The load in the transverse direction input to the suspension arm support brackets 40 and 41 is input to the beam member 103 through the load transmission members 170 and 171.

It is possible to enhance the rigidity of the parts around the suspension arm support brackets 40 and 41 by the beam member 103 even when a cross member is not arranged near the suspension arm support brackets 40 and 41. Accordingly, the steering stability and ride quality of the electric vehicle 10 are improved. In other words, it is possible to arrange part of the large-sized battery unit 14 in a space between the pair of right and left suspension arm support brackets 40 and 41. As a result of this, it becomes possible to mount the large-sized battery unit 14 on the electric vehicle, and prolong the travel distance of the electric vehicle.

As shown in FIGS. 1 and 4 to 7, an under cover 400 is arranged under the battery unit 14. A top surface of the under cover 400 is opposed to the undersurfaces of the beam members 101, 102, 103, and 104. An example of a material of the under cover 400 is a synthetic resin reinforced with glass fibers. The under cover 400 is divided into, for example, a front half portion 400a and rear half portion 400b. By connecting the front half portion 400a and rear half portion 400b to each other, one under cover 400 is constituted. It should be noted that an under cover integral over the whole length may also be used.

The battery unit 14 is fixed to the frame structure 30 by means of the bolts 147, 157, 177, 198, and 212. Thereafter, the under cover 400 is fixed to at least part of the frame structure 30 and beam members 101, 102, 103, and 104 from below the vehicle body 11 by means of bolts 401 (shown in FIG. 6).

Figure 6:
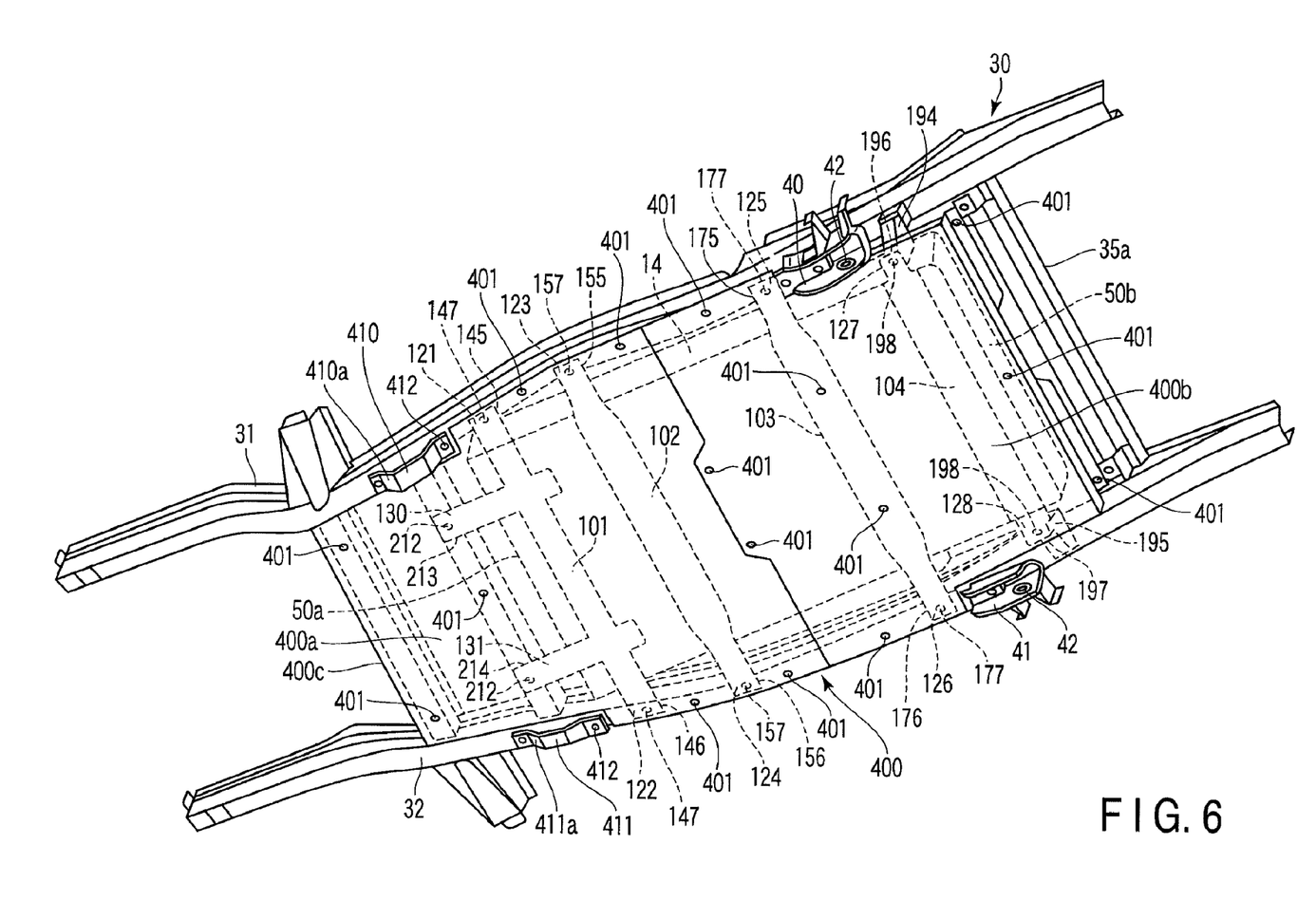
FIG. 6 is a perspective view of the frame structure and under cover of the electric vehicle shown in FIG. 1 viewed from below.

An overall length of the under cover 400 is larger than that of the battery unit 14. That is, the under cover 400 has a length sufficient to cover from the front end 50a to the rear end 50b of the battery case 50. A width of the under cover 400 is larger than that of the battery unit 14.

As shown in FIGS. 5 and 6, the under cover 400 is arranged over the pair of side members 31 and 32. A front portion of the under cover 400 is fixed to the front cross member 33a by means of the bolts 401. A central portion of the under cover 400 is fixed to the beam members 101, 102, 103, and 104, and tray member 51. A rear portion of the under cover 400 is fixed to brackets (not shown) provided on the rear cross member 35a (shown in FIG. 6) by means of bolts 401. The under cover 400 has an area sufficient to cover the whole undersurface of the battery unit 14 when viewed from below the vehicle body 11.

The under cover 400 has a shape opened on the rear side. As a result of this, the electromagnetic shield on the rear side of the battery unit 14 is constituted of the metal plates 200d, 200e, and 200f embedded in the rear portion of the tray member 51, and rear metal plate arranged on the rear surface of the cover member 52.

The bolts 147, 157, 177, 198, and 212 are covered with the under cover 400 from below. Thus, even if by any chance the bolts 147, 157, 177, 198, and 212 come off, the bolts fall onto the under cover 400. Thus, the occupant of this vehicle can recognize that a bolt has come off by the sound generated by the falling bolt striking the undercover 400, sound generated by the rolling bolt during the running, and the like.

Component dropping prevention walls 402 (shown in FIGS. 1 and 4) having a shape of an upward protrusion are formed at the peripheral edge portion of the under cover 400. It is recommended that the component dropping prevention walls 402 be provided at least at positions of the entire circumference of the under cover 400 enabling the walls 402 to prevent the bolt 147, 157, 177, 198, or 212 from rolling down from the under cover 400. A component such as the bolt or the like that has fallen onto the under cover 400 is retained inside the under cover 400 by the component dropping prevention walls 402, and hence the above component is prevented from falling onto the road.

As shown in FIG. 1, the under cover 400 is provided with a shield member 405 having an electromagnetic shielding effect. An example of the shield member 405 is a metal mesh member formed by braiding metallic wires into a reticular form.

This shield member 405 has a function of protecting the electric components 61 (shown in FIGS. 3 and 6) contained inside the battery case 50 from an electromagnetic wave. It is particularly possible to prevent an electromagnetic wave generated from the motor 12 or the like from extending to the battery case 50 from below the vehicle body 11 by means of the shield member 405 of the under cover 400. That is, the under cover 400 provided with the shield member 405 also functions as an under electromagnetic shield portion for intercepting an electromagnetic wave from below the battery unit 14.

An electric component generating an electromagnetic wave is arranged between the floor panel 70 and the under cover 400. Above the floor panel 70, electronic equipments such a radio, electronic clock, navigation system, and the like are arranged. In the electronic vehicle 10 of this embodiment, it is possible to prevent an influence of the electromagnetic wave generated from the electric component from extending to the electronic equipments by the electromagnetic shield.

It should be noted that the shield member 405 (schematically shown in FIG. 1) to be provided on the under cover 400 may be provided only on part of the under cover 400 in accordance with the intensity of the electromagnetic wave reaching the battery case 50 from below the vehicle body 11, or the area to which the electromagnetic wave extends. Further, when the intensity of the electromagnetic wave is low to such an extent that there is practically no problem, the under cover 400 may not be provided with a shield member 405.

As shown in FIGS. 2, 5, and 6, the frame structure 30 is provided with protection members 410 and 411 functioning as a battery unit protection means. In this embodiment, the battery unit protection means is constituted of the protection members 410 and 411, and under cover 400.

The protection members 410 and 411 are attached to the undersurfaces of the side members 31 and 32 by means of bolts 412. The protection members 410 and 411 are attached to the front portions of the side members 31 and 32, i.e., the portions at which the distance between the side members 31 and 32 becomes smaller toward the front wheels 20. Thus, the protection members 410 and 411 are positioned inside the pair of right and left front wheels 20 when viewed from the front of the vehicle body 11. Furthermore, the under cover 400 extends rearward behind the protection members 410 and 411.

Inclined surfaces 410a and 411a are formed at front portions of the protection members 410 and 411. These inclined surfaces 410a and 411a have a sled-like shape inclined to be higher from the front side of the side members 31 and 32 toward the rear side. A convex part of the road surface colliding against the protection members 410 and 411 from the front side of the vehicle body 11 while the vehicle is running is guided toward the rear of the protection members 410 and 411 along the inclined surfaces 410a and 411a.

The inclined surfaces 410a and 411a are positioned on the front side of the front end 50a of the battery case 50. The undersurfaces of the protection members 410 and 411 protrude downwardly from the side members 31 and 32. The undersurfaces of the protection members 410 and 411 are positioned lower than the undersurface of the front end 50a of the battery case 50. Further, the undersurfaces of the protection members 410 and 411 protrude downwardly from the undersurface of the under cover 400.

In this way, the pair of right and left protection members 410 and 411 are fixed to the side members 31 and 32 having high rigidity. Further, the beam members 101, 102, 103, and 104 each having high rigidity are arranged behind the protection members 410 and 411 above the under cover 400.

When the vehicle is passing the large convex part such as a step or the like, it can be presumed, depending on the situation, for example, that the convex part of the road surface hits the under cover 400 at around the front end 400c thereof. In this case, the load of the collision is received by the cross member 33a arranged near the front end 400c of the under cover 400, and the convex part of the road surface is guided toward the rear side of the vehicle body 11 along the under cover 400. This makes it possible to prevent the convex part of the road surface from hitting the battery unit 14.

Depending on the situation during the travel of the vehicle, it can be presumed that the convex part of the road surface collides against at least one of the protection members 410 and 411. In such a case, the inclined surfaces 410a and 411a of the protection members 410 and 411 run on the convex part of the road surface, thereby guiding the convex part toward the rear side of the vehicle body 11. In this case, the inclined surfaces 410a and 411a of the protection members 410 and 411 fulfill the function corresponding to a sled. That is, the convex part of the road surface that has hit the inclined surfaces 410a and 411a is guided toward the under cover 400. As a result of this, it is possible to prevent the convex part of the road surface from directly hitting the battery unit 14.

The beam members 101, 102, 103, and 104 each having high rigidity are arranged above the under cover 400 from the front side of the vehicle body 11 toward the rear side thereof. These beam members 101, 102, 103, and 104 are arranged behind the protection members 410 and 411. This enables the under cover 400 to exert high strength against external force applied thereto from below. Thus, it is possible to guide the convex part of the road surface that has been brought into contact with the under cover 400 toward the rear side of the vehicle body 11 along the under cover 400. In this way, the battery unit 14 can be prevented from being damaged. The under cover 400 has an effect of straightening the air current generated on the undersurface side of the vehicle body 11 while the vehicle is running, and can reduce the air resistance while the vehicle is running.

In the electric vehicle 10 of this embodiment, the battery unit 14 is arranged below the floor panel 70 made of metal. The floor panel 70 functions as an upper electromagnetic shield portion. Further, the battery unit 14 is arranged between the right and left side members 31 and 32 made of metal. That is, the side members 31 and 32 made of steel, having an effect of shielding the inside from an electromagnetic wave are arranged on both the right and left sides of the electric circuit containing section 58. These side members 31 and 32 function as electromagnetic shield portions on both the right and left sides of the battery unit 14. Further, the cross members 33, 34, and 35 can also function as electromagnetic shield portions.

Furthermore, the beam members 101, 102, 103, and 104 made of metal, functioning as the under electromagnetic shield portion are present under the battery case 50. Further, the metal plates 200a and 200d embedded in the resin constituting the battery case 50 function as the front electromagnetic shield portion and rear electromagnetic shield portion, respectively.

Moreover, the under cover 400 provided with the electromagnetic shield means such as the shield member 405 is present under the battery case 50. When the beam members 101 to 104 made of metal are present above the under cover 400, the beam members 101 to 104 exhibit an electromagnetic shielding effect. This makes it possible to reduce or omit the electromagnetic shield means to be provided on the under cover 400. That is, portions of the under cover 400 overlapping the beam members 101 to 104 when viewed from above the vehicle body 11 may not be provided with the shield member 405.

By providing the electromagnetic shield means described above, it is possible to prevent the electric components 61 inside the battery case 50 from being adversely affected by an electromagnetic wave even when the paint for electromagnetic shield is not applied to the battery case 50. Further, even if an electromagnetic wave is generated inside the battery case 50, it is possible to prevent the electromagnetic wave from being radiated to the outside of the battery case 50. According to the electromagnetic shield portions of this embodiment, it is possible not to arrange a conductive member for electromagnetic shielding on the inner surface of the battery case 50 in a naked state. As a result of this, the conductive members for electromagnetic shielding do not give rise to a short circuit, which provides safety.

In the above embodiment, an electric vehicle in which a motor for running is mounted on the rear part of the vehicle body has been described. However, the present invention can also be applied to an electric vehicle in which a motor for running is mounted on the front part of the vehicle body. Further, in carrying out the present invention, it goes without saying that the structures and arrangements of the constituent elements of the present invention such as the side members, floor panel, motor, battery unit, front electromagnetic shield portion, rear electromagnetic shield portion, under electromagnetic shield portion, and the like can be appropriately modified and implemented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electric vehicle, comprising:
   a frame structure including a pair of right and left side members made of metal, arranged at a lower part of a vehicle body, and a cross member extending in a width direction of the vehicle body;
   a floor panel made of metal provided on the frame structure;
   a battery unit including a battery case made of resin arranged between the pair of side members on an undersurface side of the floor panel, the battery case having a tray member, a cover member, a front battery containing section formed at a front half part of the battery case and a rear battery containing section formed at a rear half part of the battery case, and containing therein battery modules and electric components electrically connected to the battery modules, and an upper side of the electric components being electromagnetically shielded by the floor panel;
   a front electromagnetic shield portion provided integrally with the battery case and arranged on a front wall of the tray member with respect to the electric components which are contained in the front battery containing section, the front electromagnetic shield portion having metal insert members including metal plates that are embedded in the resin of the tray member;
   a rear electromagnetic shield portion provided integrally with the battery case and arranged on a rear wall of the tray member with respect to the electric components which are contained in the rear battery containing section, the rear electromagnetic shield portion having metal insert members including metal plates that are embedded in the resin of the tray member, the rear electromagnetic shield portion being electrically disconnected from the front electromagnetic shield portion; and
   an under electromagnetic shield portion arranged on the undersurface side of the battery case.

2. The electric vehicle according to claim 1, wherein an under cover for covering the battery case from below is arranged below the battery case, and the under electromagnetic shield portion includes a shield member provided on the under cover.

3. The electric vehicle according to claim 2, wherein beam members made of metal, extending in the width direction of the vehicle body are provided under the battery case, both end portions of these beam members are supported by the pair of side members, the under electromagnetic shield portion further includes the beam members, and
   wherein portions of the under cover overlapping the beam members when viewed from above the vehicle body are not provided with the shield member of the under cover.

4. The electric vehicle according to claim 1, further comprising:
   a center battery containing section and an electric circuit containing section that are formed between the front and rear battery containing sections of the battery case,
   wherein the center battery containing section contains battery modules that are different from the battery modules which are contained in the front and rear battery containing sections.

5. The electric vehicle according to claim 4, wherein the electric components which are electrically connected to the battery modules are arranged in the electric circuit containing section.

6. The electric vehicle according to claim 1, wherein the cover member includes a flange portion which is formed at a peripheral edge part of the cover member and a rear metal plate which is arranged behind the cover member, the flange portion being fixed to the tray member by means of bolts and nuts.

7. The electric vehicle according to claim 1, further comprising:
   a front support member fixed to the cross member,
   wherein at least one of the metal plates embedded in the resin of the battery case comprises a nut member attached to the at least one of the metal plates, and
   wherein the front support member is fixed to the front wall of the battery case by a bolt inserted into the nut member.

8. The electric vehicle according to claim 1, wherein the insert members include a metal mesh member.

* * * * *